(12) United States Patent
Liu et al.

(10) Patent No.: US 10,734,199 B2
(45) Date of Patent: Aug. 4, 2020

(54) MICROWAVE PLASMA GENERATING DEVICE FOR PLASMA OXIDATION OF SIC

(71) Applicant: INSTITUTE OF MICROELECTRONICS, CHINESE ACADEMY OF SCIENCES, Beijing (CN)

(72) Inventors: Xinyu Liu, Beijing (CN); Yidan Tang, Beijing (CN); Shengkai Wang, Beijing (CN); Yun Bai, Beijing (CN); Chengyue Yang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 115 days.

(21) Appl. No.: 16/224,435

(22) Filed: Dec. 18, 2018

(65) Prior Publication Data
US 2019/0362945 A1  Nov. 28, 2019

(30) Foreign Application Priority Data

May 25, 2018  (CN) .......................... 2018 1 0521197

(51) Int. Cl.
*H01J 37/32* (2006.01)
*C23C 8/10* (2006.01)
*H01L 21/02* (2006.01)

(52) U.S. Cl.
CPC .......... *H01J 37/32256* (2013.01); *C23C 8/10* (2013.01); *H01J 37/3244* (2013.01); *H01J 2237/20214* (2013.01); *H01J 2237/20235* (2013.01); *H01J 2237/24585* (2013.01); *H01J 2237/327* (2013.01); *H01L 21/02126* (2013.01); *H01L 21/02236* (2013.01)

(58) Field of Classification Search
USPC ............................. 118/723 MW; 156/345.41
See application file for complete search history.

(56) References Cited

U.S. PATENT DOCUMENTS 6,109,208 A * 8/2000 Tsuchihashi ........ H01J 37/3222
118/723 MA
6,246,175 B1 * 6/2001 Kou .................. H01J 37/32192
118/723 IR (Continued)

*Primary Examiner* — Rakesh K Dhingra
(74) *Attorney, Agent, or Firm* — Christensen, Fonder, Dardi & Herbert PLLC

(57) ABSTRACT

A microwave plasma generating device for plasma oxidation of SiC, comprising an outer cavity and a plurality of micro-hole/micro-nano-structured double-coupling resonant cavities disposed in the outer cavity. Each resonant cavity includes a cylindrical cavity. A micro-hole array formed by a plurality of micro-holes is uniformly distributed on a peripheral wall of the cylindrical cavity, a diameter of each of the micro-holes is an odd multiple of wavelength, and an inner wall of the cylindrical cavity has a metal micro-nano structure, the metal micro-nano structure has a periodic dimension of $\lambda/n$, where $\lambda$ is wavelength of an incident wave, and n is refractive index of material of the resonant cavity. The outer cavity is provided with an gas inlet for conveying an oxygen-containing gas into the outer cavity, and the oxygen-containing gas forms an oxygen plasma around the resonant cavities for oxidizing SiC; a stage is disposed under the resonant cavities.

10 Claims, 2 Drawing Sheets

(56) References Cited

U.S. PATENT DOCUMENTS

| | | | |
|---|---|---|---|
| 2004/0011465 A1* | 1/2004 | Matsumoto | H01J 37/32192 156/345.41 |
| 2011/0088848 A1* | 4/2011 | Kim | H01J 37/32192 156/345.41 |
| 2015/0126046 A1* | 5/2015 | Funk | H01J 37/32266 438/798 |

* cited by examiner

MICROWAVE PLASMA GENERATING DEVICE FOR PLASMA OXIDATION OF SIC

CROSS-REFERENCE TO RELATED APPLICATION(S)

This application claims priority to a Chinese Patent Application No. 201810521197.1, filed with the Chinese Patent Office on May 28, 2018 and entitled "MICROWAVE PLASMA GENERATING DEVICE FOR PLASMA OXIDATION OF SIC", which is incorporated herein by reference entirely.

TECHNICAL FIELD

The present disclosure relates to the field of plasma technology, and in particular relates to a microwave plasma generating device for plasma oxidation of SiC.

BACKGROUND

SiC is the only compound semiconductor from which $SiO_2$ can be thermally grown, which allows SiC to realize all Si MOS device structures. The thermal oxidation of SiC requires a higher oxidation temperature than Si, and the oxidation temperature is as high as 1300° C. At present, the mainstream SiC oxidation process mainly uses an electric resistance heating furnace. The main principle is based on the reaction of silicon carbide with oxygen molecules, but this method of oxidation with oxygen molecules easily causes defects such as residual carbon clusters and oxygen vacancies at the interface. Especially at such high temperatures, in addition to interface oxidation, it also causes interface damage and reduces oxidation efficiency.

In recent years, researchers have proposed a process for oxidizing SiC using microwave plasma to improve the interface quality of SiC oxidation. Microwave plasma generating devices are widely used in the semiconductor industry. The resonant cavity and coupling device are key components of the microwave plasma generating device. In order for the gas to resonate under electromagnetic fields to produce the required plasma, the resonant cavity and the coupling device need to form a strict match, and these two devices have strict dimensional requirements.

Ordinary microwave plasma excitation mainly relies on higher electric field strength, and it is difficult to rely entirely on manual design to implement the reaction cavity conforming to the requirement of generating a large area uniform electric field. The existing microwave plasma generating device has problems such as low efficiency and poor uniformity. In addition, the use of a single discharge unit is likely to cause the risk of operating temperatures being too high or too low.

SUMMARY

In order to solve the problems in the prior art, the present disclosure proposes a microwave plasma generating device for plasma oxidation of SiC, which can achieve oxidation of SiC samples with high efficiency and uniformity.

In order to achieve the above object, the present disclosure adopts the following technical solutions.

A microwave plasma generating device for plasma oxidation of SiC, comprising an outer cavity and a plurality of micro-hole/micro-nano-structured double-coupling resonant cavities disposed in the outer cavity, wherein each of the resonant cavities includes a cylindrical cavity, and a micro-hole array formed by a plurality of micro-holes is uniformly distributed on a peripheral wall of the cylindrical cavity, diameter of each of the micro-holes is an odd multiple of wavelength of an incident wave, and an inner wall of the cylindrical cavity has a metal micro-nano structure, the micro-hole array and the metal micro-nano structure form a double-coupling structure to achieve resonance enhancement and tunability, the metal micro-nano structure has a periodic dimension of $\lambda/n$, where $\lambda$, is wavelength of the incident wave, and n is refractive index of material of the resonant cavity, the outer cavity is provided with an gas inlet for conveying an oxygen-containing gas into the outer cavity, and the oxygen-containing gas forms an oxygen plasma around the resonant cavities for oxidizing SiC, a stage is disposed under the resonant cavities for supporting a SiC substrate.

Preferably, the circumference of the cylindrical cavity is an integral multiple of ¾ of an operating wavelength, and resonance occurs on a first odd mode.

Preferably, the metal micro-nano structure is a periodically arranged protrusion, recess or grating.

Preferably, the metal micro-nano structure is a grating comprising parallel slits of equal width and equal spacing.

Preferably, the cylindrical cavity is made of mica or ceramic material, and the metal plating layer of the metal micro-nano structure is made of Au or brass.

Preferably, the diameter of each of the micro-holes is an odd multiple of wavelength.

Preferably, the resonant cavities are arranged in a line and are respectively connected to a microwave generator through a double-layer coaxial cable.

Preferably, the double-layer coaxial cable wraps a coupling probe, one end of the double-layer coaxial cable is connected to the microwave generator, and other end is inserted into the micro-hole/grating double-coupling resonant cavity.

Preferably, the outer cavity is a quartz tube.

Preferably, the stage is movable up and down and rotatable.

Preferably, a visual observation hole and a pyrometer are provided on the outer cavity adjacent to the stage.

Preferably, the microwave input power of the microwave plasma generating device is continuously adjustable in a range of 800 w-2000 w, and the microwave frequency is adjustable in a range of 2.4-2.5 GHz.

As compared with the prior art, the present disclosure has the following advantages:

(1) The present disclosure optimizes the design of the double-coupling resonance mode to reduce the loss of the guided mode and the leaky mode, and achieves the goal of maximizing the resonance and making it adjustable in the fixed area. In addition, the present disclosure can improve the uniformity of the plasma, make the plasma oxidation temperature up to 1000° C., make the plasma discharge time adjustable, and realize the stepwise plasma oxidation process better;

(2) The micro-hole of the metal plate of the present disclosure adopts a double-coupling structure and can improve the absorption loss under the premise of ensuring the optical coupling and the local enhancement of the field space;

(3) Multiple resonant cavities are independently controlled to effectively control the temperature of the plasma.

DETAILED DESCRIPTION

To make the objectives, technical solutions, and advantages of the present disclosure clearer, the present disclosure will be further described in detail below in conjunction with the specific embodiments and with reference to the accompanying drawings.

The biggest disadvantage of using conventional microwave plasma oxidation of SiC samples is low efficiency and poor uniformity. The present disclosure adopts unique resonant cavity design, double coupling structure design, multi-array discharge and resonance unit design, tunable stage, etc., and can realize oxidation of SiC samples with high efficiency and uniformity.

The energy within the resonant cavity is divided into a resonant outside emission F-P mode (Fabry-Perot mode), a guided mode, a leaky mode, and an absorption mode. Only the F-P mode may be emitted and extracted, and the other three parts are lost to varying degrees, which is a great waste of energy. Therefore, the design of the resonant cavity must reduce the energy loss of the non-exit mode in the cavity. At the same time, the resonant cavity design is especially important to achieve resonance enhancement in a given area. The present disclosure optimizes the design of the double-coupling resonance mode to reduce the loss of the guided mode and the leaky mode, and achieves the goal of maximizing the resonance in the fixed area.

Figure 1:
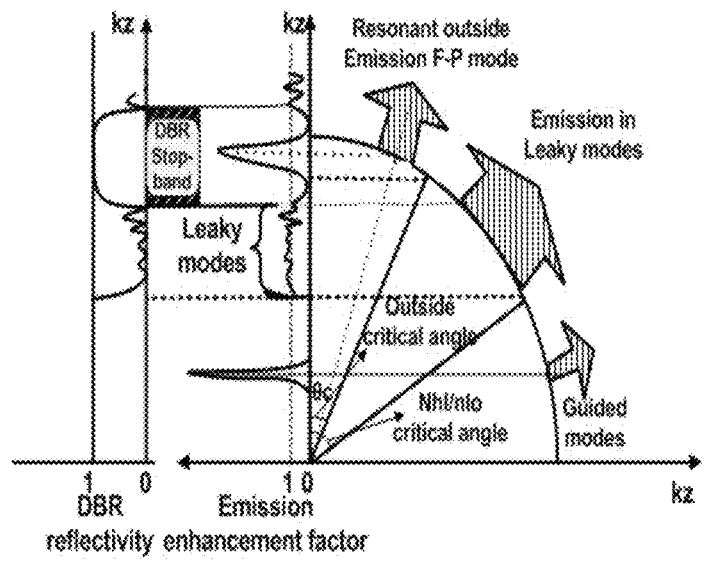
FIG. 1 is a graph showing the relationship between the energy distribution within the resonant cavity and the emission enhancement factor.

The relationship between the mode distribution within the cavity and the emission enhancement factor is shown in FIG. 1. According to the coupling resonance mechanism, the outgoing wave in the cavity is directly used as the incident wave that causes a gas to become a plasma.

The present disclosure adjusts the parameters to reduce the loss of the energy of the exit mode within the resonant cavity, and achieves the purpose of enhancing the total radiant energy in the fixed region, that is, not only there is a high light intensity near kx corresponding to the resonant outside emission F-P mode, but also an energy spike appears at k corresponding to the guide mode and the leaky mode; the micro-hole of the metal plate adopts a double-coupling structure and can improve the absorption loss under the premise of ensuring the optical coupling and the local enhancement of the field space.

Figure 2:
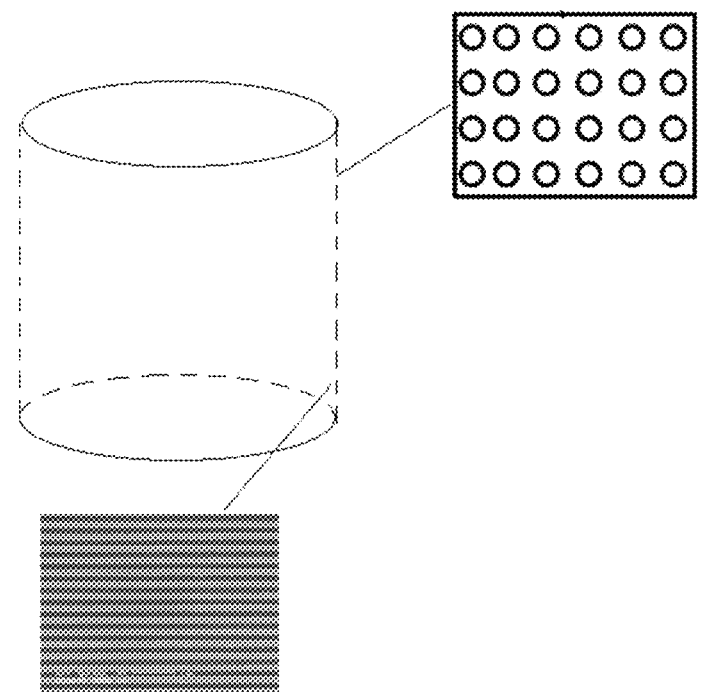
FIG. 2 is a micro-hole/micro-nano-structured double-coupling resonant cavity according to an embodiment of the present disclosure.

As shown in FIG. 2, the micro-hole/micro-nano-structured double-coupling resonant cavity of the present disclosure comprises a cylindrical cavity. A micro-hole array formed of a plurality of micro-holes is evenly distributed on the peripheral wall of the cylindrical cavity, and the inner wall of the cylindrical cavity has a metal micro-nano structure.

The material of the resonant cavity is mica or ceramic material with a dielectric constant of 9-10 and a refractive index of 1.5-2.0. To prevent oxidation of the inner layer, the metal micro-nano structure is made of Au or brass. The metal micro-nano structure is a periodically arranged microstructure, which may be a protrusion, a recess or a grating. In the embodiment of the present disclosure, the metal micro-nano structure adopts a grating structure and is periodically composed of parallel slits of equal width and equal spacing. The metal micro-nano structure has a periodic dimension of $\lambda/n$, where $\lambda$, is the incident wavelength and n is the refractive index of the cavity material, which prevents the microwave energy from penetrating into or being absorbed by the metal and media surfaces. The metal micro-nano structure may be formed by a conventional semiconductor process, for example, by performing photolithography after forming a metal plating layer.

A plurality of micro-holes are evenly distributed on the peripheral wall of the resonant cavity. The size of the micro-hole is an odd multiple of the wavelength, corresponding to the nodes of the standing wave of the microwave, respectively, so that as much microwave energy as possible is radiated into the reaction cavity through the micro-holes.

The greater the energy density in the resonant cavity, the greater the intensity of the generated microwave electric field. Therefore, the metal plate with holes on both sides is used to isolate the microwave. The formed resonant cavity with micro-holes may isolate the microwave, but does not isolate the gas, so that the microwave may be increased in a specified area, and the enhanced microwave is leaked out through the micro-holes to cause the gas to become the plasma.

When designing the size of the micro-hole/micro-nano-structured double-coupling resonant cavity, it is strictly required that the circumference is an integral multiple of ¾ of the operating wavelength, and the resonance occurs on the first odd mode, which is beneficial to the microwave plasma excitation process.

Figure 3:
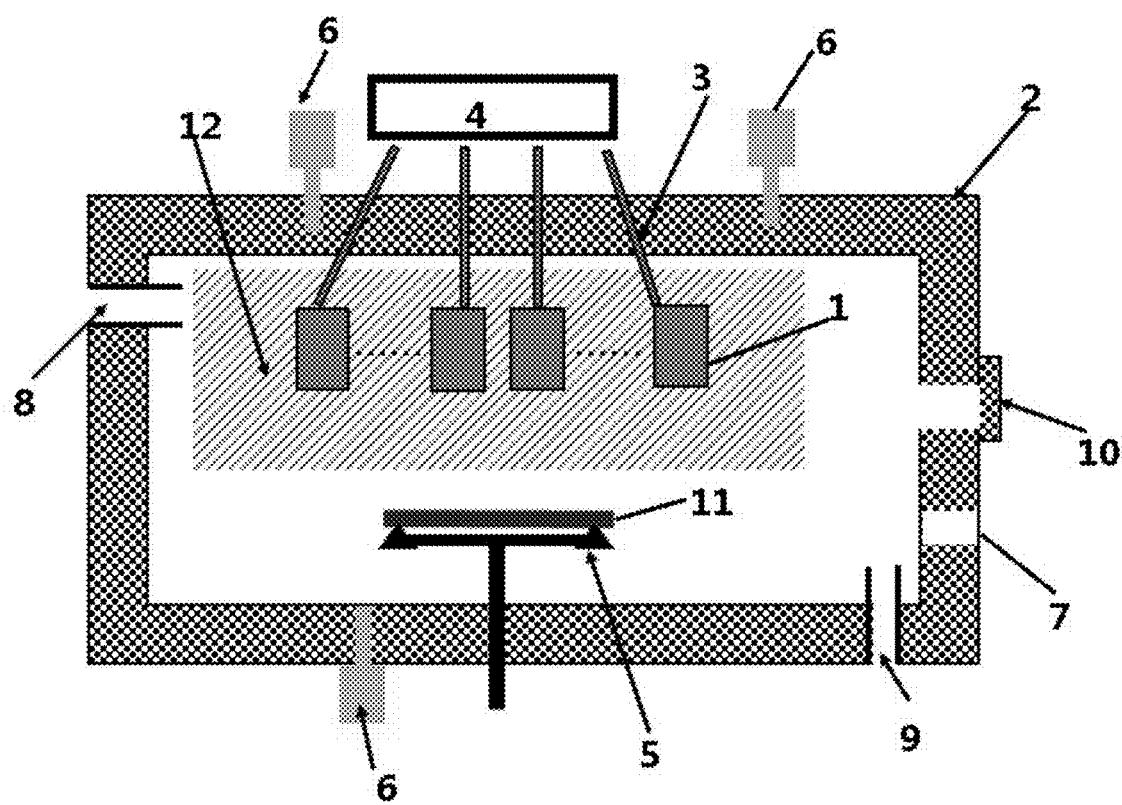
FIG. 3 is a microwave plasma generating device according to the present disclosure.

The metal plating layer allows the internal leaky mode to interact with the surface pattern of the metal film fabricated on the device surface to generate a coupling resonance at the cavity material and the metal micro-nano structure. Thus the SP (surface plasmon) wave (non-radiation mode) generated by the incident wave in the leaky mode and the free electrons on the metal surface oscillating in the same frequency may be converted into the coupled SP wave (radiation mode). That is, the incident wave in the leaky mode may be converted into the coupled SP wave in the coupled SP mode. Through such conversion of mode and energy, light in the SP coupled resonance mode may tunnel and a reinforcement effect may be obtained at the resonant wavelength. In this way, radiation enhancement may be increased by at least 2-3 times. As shown in FIG. 3, the microwave plasma generating device for plasma oxidation of SiC provided by the present disclosure comprises a plurality of micro-hole/micro-nano-structured double-coupling resonant cavities 1, and the resonant cavities 1 are disposed within the outer cavity 2. The outer cavity 2 may be a quartz tube for sealing and isolating the working space (reaction cavity). The outer cavity 2 may have an inner diameter of 100-150 mm. The plurality of resonant cavities 1 are arranged in a line and are respectively connected to a microwave generator 4 through a double-layer coaxial cable 3. The double-layer coaxial cable 3 wraps a coupling probe, and one end of the double-layer coaxial cable 3 is connected to the microwave generator 4, and the other end is inserted into the resonant cavity 1. At the end of the double-layer coaxial cable 3 inserted into the resonant cavity 1, the coupling probe projects out of the double-layer coaxial cable 3. The microwave generator 4 is placed in the middle of the plurality of resonant cavities 1 in the form of a disk and may be used to adjust the length and the resonant frequency of the reaction cavity.

The reaction cavity system is a key component of the operation of the device. To ensure the uniformity and symmetry of the microwave feeding into the reaction cavity and the processing convenience, the reaction cavity is designed to be cylindrical to excite the plasma.

The microwave input power is continuously adjustable in a range of 800 w-2000 w, and the frequency of the microwave that excites the microwave plasma is adjustable in a range of 2.4-2.5 GHz, and the sweep step size is set to 0.1 MHz.

Each double-layer coaxial cable 3 may be a 10 cm coaxial cable.

A stage 5 is disposed in the outer cavity 2, the stage 5 is movable up and down and rotatable and may have a diameter of 4-6 inches. A pyrometer 6 and a visual observation hole 7 are provided on the outer wall of the outer cavity 2 adjacent to the stage 5, and the reaction state in the cavity may be monitored at any time. A plurality of pyrometers 6 may be disposed on the outer wall of the outer cavity 2.

The outer cavity 2 is provided with a gas inlet 8 at one end and a gas outlet 9 and a device door 10 at the other end.

When the microwave plasma is generated, the substrate 11 to be processed may be placed on the stage 5, gas is introduced from the gas inlet 8, and then the microwave plasma generating device is activated to generate the plasma in the reaction zone 12 above the substrate 11. The substrate 11 is subjected to plasma treatment by the plasma.

The operating temperature of the microwave plasma generating device may be 400-1000° C., the corresponding plasma discharge time is 400 s-1000 s, and the gas pressure in the cavity is 400 mTorr-1000 mTorr.

In one embodiment of the present disclosure, the microwave plasma generating device is used to achieve two-step low temperature oxidation of SiC, the corresponding plasma discharge time being tunable. The present disclosure adopts a method of independently arranging 2-10 independent resonant cavities 1. The number of resonant cavities 1 near the upper side of the stage is greater than the number of resonant cavities 1 at other positions to ensure the low temperature oxidation of the entire cavity.

In this embodiment, the microwave plasma generating device causes oxygen molecules to form oxygen radicals or oxygen plasmas, which react with the silicon carbide surface instead of oxygen molecules. Thereby, the corresponding temperature and surface oxygen concentration are lowered, which suppresses the formation of etch pits on the SiC surface, reduces surface damage, and obtains a relatively flat surface, thereby improving carrier mobility of the MOSFET device at high temperature and high field.

In this embodiment, the specific operating steps are as follows. Microwave input power of 800 w-1000 w is selected, and the frequency of the microwave that excites the microwave plasma may be adjusted in the range of 2.4-2.5 GHz. In an environment where the gas pressure is 100 mTorr and $H_2:O_2=1:1$, the initial temperature of the stage on which the sample is set is set to 100° C., the plasma is heated at a rate of 1° C./s, and after reaching 350° C., low temperature oxidation is performed with the plasma discharge time of 400 s. Then, the heating rate is changed to 0.5° C./s, and the temperature is raised to the preset microwave plasma oxidation temperature of 800° C. Then, the gas is changed to pure oxygen, the gas pressure is changed to 800 mTorr, high temperature (lower than the furnace tube oxidation temperature of 1300° C.) oxidation is performed with the plasma discharge time of 800 s, and the thickness of the oxide layer is about 30 nm. After the oxidation is completed, the pure oxygen is changed to pure nitrogen, and the temperature is cooled under a nitrogen atmosphere.

The specific embodiments described above further illustrate the purpose, technical solutions and beneficial effects of the present disclosure. It should be understood that the above description is only specific embodiments of the present disclosure and is not used to limit the present disclosure. Any modification, equivalent replacement, and improvement made within the spirit and principle of the present disclosure shall fall within the protection scope of the present disclosure.

What is claimed is:

1. A microwave plasma generating device for plasma oxidation of SiC, comprising
   an outer cavity and
   a plurality of micro-hole/micro-nano-structured double-coupling resonant cavities disposed in the outer cavity,
   wherein each of the micro-hole/micro-nano-structured double-coupling resonant cavities includes a cylindrical cavity, and a micro-hole array formed by a plurality of micro-holes is uniformly distributed on a peripheral wall of the cylindrical cavity,
   diameter of each of the micro-holes is an odd multiple of wavelength of an incident wave, and
   an inner wall of the cylindrical cavity has a metal micro-nano structure, the micro-hole array and the metal micro-nano structure form a double-coupling structure to achieve resonance enhancement and tunability,
   the metal micro-nano structure has a periodic dimension of $\lambda/n$, where $\lambda$ is wavelength of the incident wave, and n is refractive index of material of the resonant cavity,
   the outer cavity is provided with an gas inlet for conveying an oxygen- containing gas into the outer cavity, and
   the oxygen-containing gas forms an oxygen plasma around the micro-hole/ micro-nano-structured double-coupling resonant cavities for oxidizing SiC,
   a stage is disposed under the micro-hole/micro-nano-structured double-coupling resonant cavities for supporting a SiC substrate.

2. The microwave plasma generating device according to claim 1, wherein a circumference of the cylindrical cavity is an integral multiple of ¾ of an operating wavelength, and resonance occurs on a first odd mode.

3. The microwave plasma generating device according to claim 1, wherein the metal micro-nano structure is a periodically arranged protrusion, recess or grating.

4. The microwave plasma generating device according to claim 1, wherein the metal micro-nano structure is a grating comprising parallel slits of equal width and equal spacing.

5. The microwave plasma generating device according to claim 1, wherein the cylindrical cavity is made of mica or ceramic material, and a metal plating layer of the metal micro-nano structure is made of Au or brass.

6. The microwave plasma generating device according to claim 1, wherein the plurality of the micro-hole/micro-nano-structured double-coupling resonant cavities are arranged in a line and are respectively connected to a microwave generator through a corresponding double-layer coaxial cable.

7. The microwave plasma generating device according to claim 6, wherein the double- layer coaxial cable wraps a coupling probe, one end of each of the double-layer coaxial cable is connected to the microwave generator, and the other end is inserted into the corresponding micro-hole/ micro-nano-structured double-coupling resonant cavity.

8. The microwave plasma generating device according to claim 1, wherein the outer cavity is a quartz tube, and the stage is movable up and down and rotatable.

9. The microwave plasma generating device according to claim 1, wherein a visual observation hole and a pyrometer are provided on the outer cavity adjacent to the stage.

10. The microwave plasma generating device according to claim 1, wherein a microwave input power of the microwave plasma generating device is continuously adjustable in a range of 800 w-2000 w, and a microwave frequency is adjustable in a range of 2.4-2.5 GHz.

\* \* \* \* \*